(12) United States Patent
Akram

(10) Patent No.: US 6,314,641 B1
(45) Date of Patent: Nov. 13, 2001

(54) INTERCONNECT FOR TESTING SEMICONDUCTOR COMPONENTS AND METHOD OF FABRICATION

(75) Inventor: Salman Akram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/639,168

(22) Filed: Aug. 16, 2000

Related U.S. Application Data (62) Division of application No. 09/234,725, filed on Jan. 21, 1999, now Pat. No. 6,242,935.

(51) Int. Cl.$^7$ .................................................. H01R 9/00

(52) U.S. Cl. .......................... 29/843; 29/852; 324/755; 438/18

(58) Field of Search .................. 29/843, 830, 825, 29/852; 438/18, 618, 666; 324/755

(56) References Cited

U.S. PATENT DOCUMENTS

| | | |
|---|---|---|
| 3,809,625 | 5/1974 | Brown et al. . |
| 4,617,730 * | 10/1986 | Geldermans et al. ................ 29/843 |
| 4,764,804 | 8/1988 | Sahara et al. . |
| 5,046,239 | 9/1991 | Miller et al. . |
| 5,056,216 * | 10/1991 | Madou et al. ........................ 29/843 |
| 5,239,260 | 8/1993 | Widder . |
| 5,289,631 | 3/1994 | Koopman et al. . |
| 5,329,423 | 7/1994 | Scholz . |
| 5,341,564 | 8/1994 | Akhavain et al. . |
| 5,376,584 | 12/1994 | Agarwala . |
| 5,461,261 | 10/1995 | Nishiguichi . |
| 5,534,465 | 7/1996 | Frye et al. . |
| 5,569,960 | 10/1996 | Kumazawa et al. . |
| 5,589,319 | 12/1996 | Katou et al. . |
| 5,607,818 | 3/1997 | Akram et al. . |
| 5,616,448 | 4/1997 | Kato . |
| 5,625,298 | 4/1997 | Hirano et al. . |
| 5,682,061 | 10/1997 | Khandros et al. . |
| 5,691,041 | 11/1997 | Frankeny et al. . |
| 5,699,612 * | 12/1997 | Inoue et al. ........................... 29/843 |
| 5,739,696 | 4/1998 | Hermann et al. . |
| 5,789,271 | 8/1998 | Akram . |
| 5,793,117 | 8/1998 | Shimada et al. . |
| 5,808,360 | 9/1998 | Akram . |
| 5,915,755 | 6/1999 | Gochnour et al. . |
| 5,915,977 | 6/1999 | Hembree et al. . |
| 5,931,685 | 8/1999 | Hembree et al. . |
| 5,952,840 | 9/1999 | Farnworth . |
| 5,962,921 | 10/1999 | Farnworth et al. . |

(List continued on next page.)

OTHER PUBLICATIONS

Amagai, Masazumi, "Chip Scale Packages for Center–Pad Memory Devices", Chip Scale Review, pp. 68–77, May 1998.

Primary Examiner—Carl J. Arbes
(74) Attorney, Agent, or Firm—Stephen A. Gratton (57) ABSTRACT

An interconnect for testing semiconductor components contained on a substrate, such as dice on a wafer, or chip scale packages on a panel is provided. Also provided is a test system employing the interconnect, and a method for fabricating the interconnect. The interconnect includes a substrate having a polymer layer thereon, and a pattern of contacts formed on the polymer layer. The contacts can be configured to form temporary electrical connections with planar contacts (e.g., bond pads) or ball contacts (e.g., solder bumps or solder balls) on the components under test. The polymer layer allows the contacts to move in the z-direction to accommodate dimensional and planar variations in the component contacts. The interconnect also includes conductive members formed in the substrate, for providing direct electrical paths from the interconnect contacts, to contact pads on a back side of the substrate.

18 Claims, 5 Drawing Sheets

U.S. PATENT DOCUMENTS

| | | |
|---|---|---|
| 6,005,288 | 12/1999 | Farnworth et al. . |
| 6,016,060 | 1/2000 | Akram et al. . |
| 6,025,731 | 2/2000 | Hembree et al. . |
| 6,040,702 | 3/2000 | Hembree et al. . |
| 6,078,186 | 6/2000 | Hembree et al. . |
| 6,091,252 | 7/2000 | Akram et al. . |
| 6,107,109 | 8/2000 | Akram et al. . |
| 6,107,119 | 8/2000 | Farnworth et al. . |
| 6,114,240 | 9/2000 | Akram et al. . |
| 6,127,736 | 10/2000 | Akram . |
| 6,130,148 | 10/2000 | Farnworth et al. . |
| 6,208,156 | 3/2001 | Hembree . |
| 6,208,157 | 3/2001 | Akram et al. . |
| 6,222,280 | 4/2001 | Farnworth et al. . |
| 6,232,243 | 5/2001 | Farnworth et al. . |
| 6,242,935 | 6/2001 | Akram . |

\* cited by examiner

INTERCONNECT FOR TESTING SEMICONDUCTOR COMPONENTS AND METHOD OF FABRICATION

CROSS REFERENCE TO RELATED APPLICATIONS

This application is a division of application Ser. No. 09/234,725, filed Jan. 21, 1999, now U.S. Pat. No. 6,242, 935.

FIELD OF THE INVENTION

This invention relates generally to semiconductor manufacture and specifically to an interconnect for testing semiconductors components such as wafers containing semiconductor dice, and substrates containing semiconductor packages.

BACKGROUND OF THE INVENTION

Semiconductor components can be manufactured using wafer level fabrication processes in which multiple components are contained on a single substrate. Semiconductor dice, for example, are typically fabricated on substrates in the form of silicon wafers. Following the fabrication process, the dice can be singulated into individual units.

Semiconductor packages, such as BGA packages, can also be manufactured using wafer level fabrication processes. A BGA package includes an array of external ball contacts, such as solder balls, that permit the package to be surface mounted to a printed circuit board (PCB) or other electronic component. Some BGA packages have a foot print that is about the size of the die contained in the package. These BGA packages are also known as chip scale packages.

Multiple BGA packages can be fabricated on a single substrate formed of an electrically insulating material. Sometimes the substrate comprises a reinforced polymer laminate, such as bismaleimide triazine (BT), or an epoxy resin (e.g., FR-4). BGA packages can also be fabricated using ceramic or silicon substrates. The substrate can be in the form of a wafer, or in the form of a panel of material.

During, or following, the fabrication process it is usually necessary to perform test procedures on the components to evaluate various electrical characteristics of the components. For example, wafer probe testing can be used to evaluate the gross functionality of dice contained on a wafer.

In order to perform the test procedures it is necessary to make temporary electrical connections with contacts on the components. Semiconductor dice typically include contacts in the form of planar aluminum bond pads, or bond pads bumped with solder bumps. Semiconductor packages typically include contacts in the form of solder balls arranged in a dense area array. For making these temporary electrical connections an interconnect is employed. A wafer probe card is one type of interconnect, and includes probe needles that electrically engage the bond pads on the wafer.

As semiconductor components become smaller, and the contacts on the components become more dense, the temporary electrical connections with the contacts become more difficult to make. Variations in the size and location of the contacts also make the temporary electrical connections difficult to make. In particular, the z-direction location and planarity of contacts can vary between different components on a substrate, and can vary between contacts on the same component. This makes it difficult to make reliable electrical connections with the contacts.

In addition, the contacts can be damaged by the interconnect. Solder balls are particularly susceptible to deformation and loosening of the solder joints that hold the balls on the components. Also, native oxide layers are usually present on the component contacts, and these oxide layers must be penetrated by the contacts on the interconnect. This requires application of forces for scrubbing or penetrating the contacts on the components.

The present invention is directed to an interconnect that can be used to test multiple components contained on a substrate. The interconnect includes contacts that are configured to accommodate dimensional variations, and to accommodate different z-axis locations of the contacts on the components.

SUMMARY OF THE INVENTION

In accordance with the present invention, an interconnect for testing semiconductor components, a test system employing the interconnect, and a method for fabricating the interconnect, are provided. The interconnect is configured to test multiple components contained on a substrate, such as semiconductor dice contained on a wafer, or chip scale packages contained on a panel. In addition, the interconnect can be configured to test semiconductor components having planar contacts, such as bond pads, or to test semiconductor components having ball contacts, such as solder bumps on bumped dice, or solder balls on chip scale packages.

The interconnect, broadly stated, comprises: a substrate; a polymer layer formed on a face of the substrate; a pattern of contacts formed on the polymer layer; and conductive members in the substrate for providing electrical paths from the contacts to external contact pads on a back side of the substrate.

The interconnect substrate comprises an electrically insulating material such as glass reinforced resin, or ceramic, or alternately a semiconducting material, such as silicon. The polymer layer comprises a resilient or compliant material such as polyimide, or a photosensitive polyimide which simplifies the fabrication process. The polymer layer provides a resilient or compliant support structure for the interconnect contacts such that movement in the z-direction is possible. This allows the interconnect contacts to move during a test procedure to accommodate differences in the z-axis location, or planarity, of the contacts on the components.

For testing components with planar contacts, the interconnect contacts comprise bumps deposited on conductive layers formed in recesses in the polymer layer. For testing components with ball contacts, the interconnect contacts comprise recesses in the polymer layer covered with conductive layers. In either embodiment the interconnect contacts are in electrical communication with conductive members, which can comprise openings in the interconnect substrate at least partially filled with a conductive material.

The conductive members provide straight line electrical paths from the interconnect contacts to the external contact pads on the back side of the interconnect. The contact pads are configured for electrical engagement by spring loaded electrical connectors (e.g.,"POGO PINS") in electrical communication with test circuitry. In addition to performing an electrical function the spring loaded electrical connectors can also perform a force applying function for biasing the interconnect against the components.

A system constructed in accordance with the invention comprises: a tester having a test head in electrical communication with test circuitry; a probe card mounted to the test head; an interconnect mounted to the probe card; a force applying mechanism having spring loaded electrical connectors in electrical communication with the test circuitry and adapted to press the interconnect against the components; and a wafer chuck for supporting and aligning the components to the interconnect.

DETAILED DESCRIPTION OF THE PREFERRED EMBODIMENTS

Referring to FIGS. 1A–1D, 2A–2B, and 3, various prior art substrates containing semiconductor components are illustrated. As will be further explained, an interconnect can be constructed in accordance with the invention for electrically contacting each of the substrates, as well as other types of substrates containing semiconductor components.

Figure 1A:
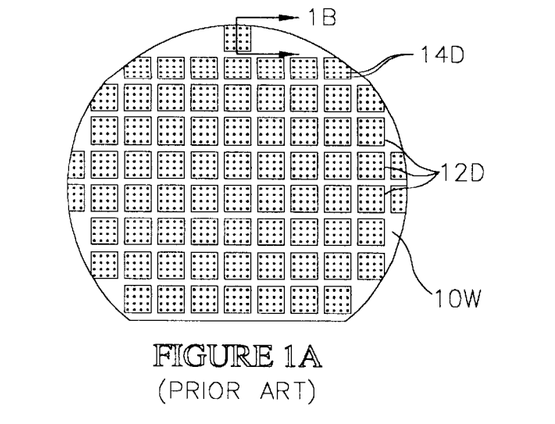
FIG. 1A is a schematic plan view of a prior art substrate in the form of a semiconductor wafer containing multiple semiconductor dice.
Figure 1B:
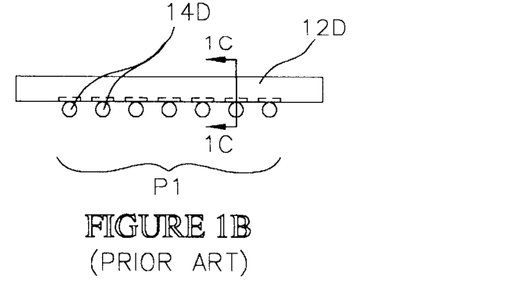
FIG. 1B is an enlarged cross sectional view taken along section line 1B—1B of FIG. 1A illustrating a semiconductor die on the wafer.

In FIG. 1A, a substrate comprises a semiconductor wafer 10W containing a plurality of components in the form of semiconductor dice 12D. Typically, the semiconductor wafer 10W comprises a semiconducting material such as silicon or gallium arsenide. FIG. 1B illustrates a die 12D that has been separated from the wafer 10W. Each die 12D includes an array of ball contacts 14D, such as solder bumps, formed on a face thereof. The ball contacts 14D are formed in a pattern P1, such as a dense grid array.

Figure 1C:
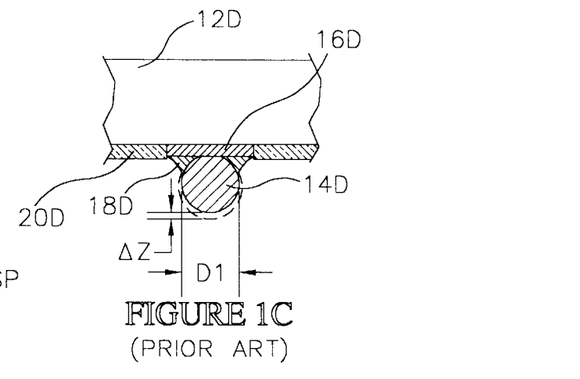
FIG. 1C is an enlarged cross sectional view taken along section line 1C—1C of FIG. 1B illustrating a bumped bond pad on the die.

As shown in FIG. 1C, the ball contacts 14D are bonded to planar bond pads 16D on the die 12D in electrical communication with the integrated circuits contained on the die 12D. The bond pads 16D are embedded in a die passivation layer 20D formed on the face of the die 12D. As also shown in FIG. 1C, solder fillets 18D attach the ball contacts 14D to the bond pads 16D.

Figure 3:
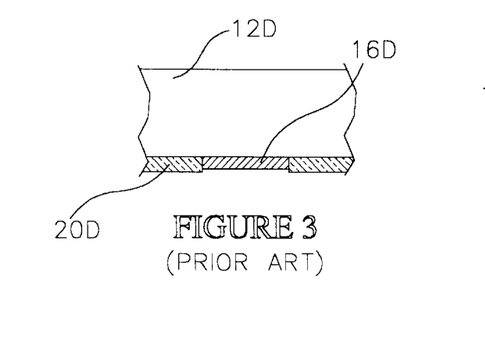
FIG. 3 is an enlarged cross sectional view equivalent to FIG. 1C illustrating a planar bond pad on the die.

Alternately, as shown in FIG. 3, the ball contacts 14D are omitted on some types of dice, such that the bond pads 16D provide planar contacts for the die 12D. In either case, dimensional variations, such as the size or location of the ball contacts 14D, can cause differences in the z-axis location, or planarity, of the ball contacts 14D, or the bond pads 16D on the die 12D. In FIG. 1C this z-axis difference is indicated by the dotted lines which represent a larger ball contact 14D, and the delta z which represents the size difference of the larger ball contact 14D. In general, these z-direction variations can occur among ball contacts 14D on the same die 12D, or on different dice 12D contained on the same wafer 10W.

Figure 2A:
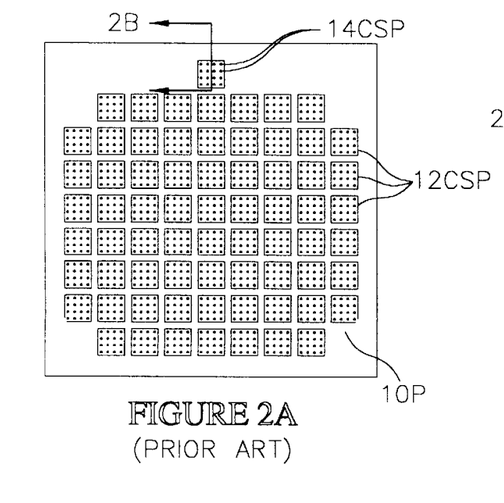
FIG. 2A is a schematic plan view of a prior art substrate in the form of a panel containing multiple semiconductor packages.

Referring to FIG. 2A, a substrate comprises a panel 10P containing a plurality of semiconductor components in the form of chip scale packages 12CSP. Typically, the panel 10P comprises an electrically insulating material such as ceramic, a reinforced polymer laminate, such as bismaleimide triazine (BT), or an epoxy resin (e.g., FR-4).

Figure 2B:
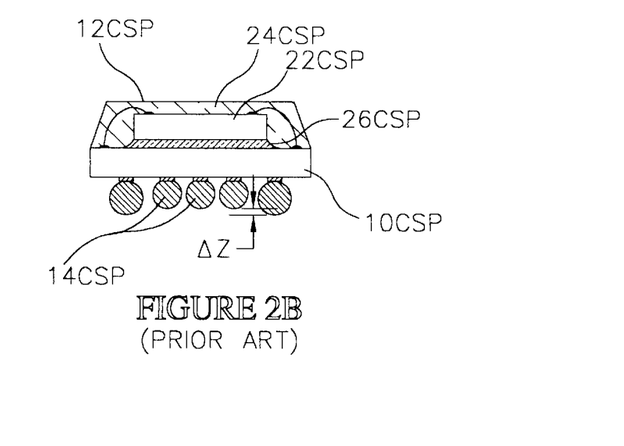
FIG. 2B is an enlarged cross sectional view taken along section line 2B—2B of FIG. 2A illustrating a semiconductor package on the panel.

As shown in FIG. 2B, each chip scale package 12CSP includes a substrate 10CSP. The substrate 10CSP comprises a segment of the panel 10P which has been cut, sheared, punched or otherwise separated from a remainder of the panel 10P. In addition, each chip scale package 12CSP includes a semiconductor die 22CSP wire bonded to the substrate 10CSP, and an adhesive layer 26CSP which attaches the die 22CSP to the substrate 10CSP. Each chip scale package 12CSP also includes an array of ball contacts 14CSP in electrical communication with the integrated circuits contained on the die 22CSP.

The ball contacts 14CSP are attached to the substrate 10CSP in a dense grid array, such as a ball grid array (BGA). By way of example, a representative diameter D1 for the ball contacts 14CSP can be about 0.005-in (0.127 mm) to 0.050-in (1.270 mm) or greater. A representative pitch P (center to center spacing) of the ball contacts 14CSP can be from about 0.008-in (0.228 mm) to about 0.060-in (1.524 mm) or greater. Due to differences in the diameters and locations of the ball contacts 14CSP, the z-axis location, or planarity, of the ball contacts 14CSP in the array can vary. This dimensional variation is indicated by delta z in FIG. 2B. In addition, the variation can occur between ball contacts 14CSP on the same component or between ball contacts 14CSP on different components on the panel 10P.

Figure 4:
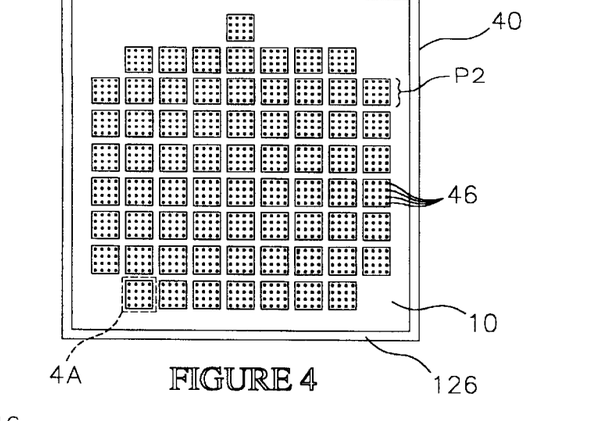
FIG. 4 is a schematic plan view of an interconnect constructed in accordance with the invention configured for testing semiconductor components having ball contacts.
Figure 4A:
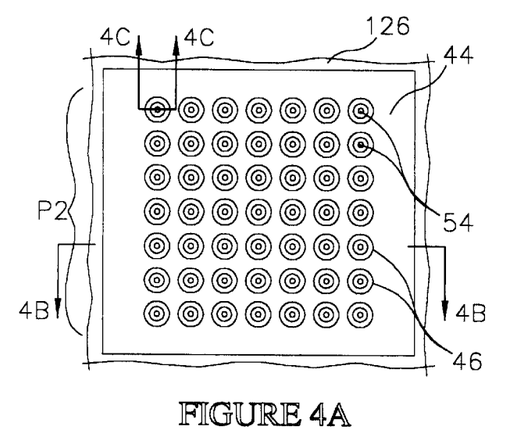
FIG. 4A is an enlarged portion of FIG. 4 taken along section line 4A illustrating a pattern of contacts on the interconnect.
Figure 4B:
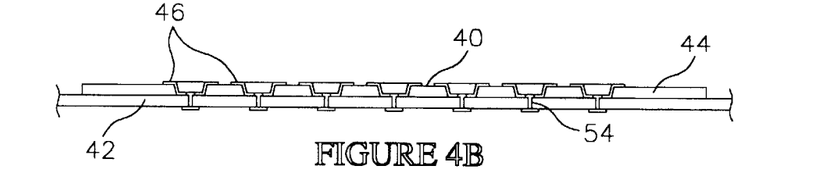
FIG. 4B is a cross sectional view of a portion of the interconnect taken along section line 4B—4B of FIG. 4A.
Figure 4C:
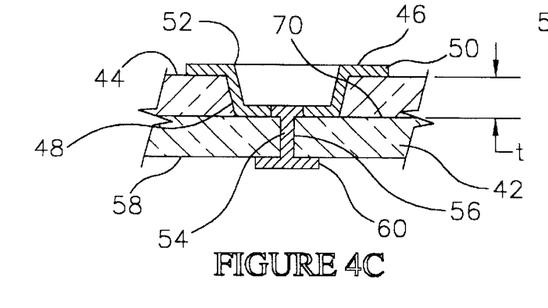
FIG. 4C is an enlarged cross sectional view taken along section line 4C—4C of FIG. 4A illustrating a contact on the interconnect.

Referring to FIGS. 4–4C, an interconnect 40 constructed in accordance with the invention is illustrated. The interconnect 40 comprises: a substrate 42; a polymer layer 44 formed on a face 70 of the substrate 42; a plurality of patterns P2 of contacts 46 formed on the polymer layer 44 and adapted to make temporary electrical connections with ball contacts 14CSP (FIG. 4D) on semiconductor components 12CSP (FIG. 2A) contained on panel 10P (FIG. 2A); and a plurality of external contact pads 60 formed on a back side 58 of the substrate 42 in electrical communication with the contacts 46.

In the illustrative embodiment the interconnect 40 has a generally square peripheral outline which corresponds to the square panel 10P (FIG. 2A). However, this outline is merely exemplary. Alternately other outlines, such as an outline that corresponds to that of a semiconductor wafer can be employed (e.g., generally circular with a major flat). In addition, as will be more fully hereinafter explained, the interconnect 40 includes a stepped surface 126 for mounting purposes.

The substrate 42 can comprise an electrically insulating material such as ceramic, or a reinforced polymer laminate, such as bismaleimide triazine (BT), or an epoxy resin (e.g., FR-4). The substrate 42 can also comprise a semiconducting material such as silicon, silicon-on-glass, or gallium arsenide, in which case additional insulating layers can be formed on the substrate 42 as will be hereinafter described.

The polymer layer 44 comprises an electrically insulating material having a natural resiliency, or compliancy, that permits the contacts 46 to move in the z-direction during a test procedure using the interconnect 40. The permits the contacts 46 to make reliable electrical connections even with z-direction variations among the contact balls 14CSP (e.g., delta z in FIG. 2B).

Suitable materials for the polymer layer 44 include polyimide, photoimageable polyimide, polyester, epoxy, urethane, polystyrene, silicone and polycarbonate. These materials can be cast in place to a desired thickness using known processes such as spin on, or dispensing through a nozzle. Alternately, these materials can be in the form of a tape, such as "KAPTON" tape, which can be applied to the substrate 42 using an adhesive layer. A representative thickness "t" (FIG. 4C) for the polymer layer 44 can be from 0.5 $\mu$m to 150 $\mu$m.

As shown in FIG. 4C, the polymer layer 44 includes recesses 48 wherein the contacts 46 are formed. The recesses 48 can be etched by forming a mask (not shown) on the polymer layer 44, such as a photopatterned resist mask, and then etching the polymer layer 44 through openings in the mask, using an etchant. With the polymer layer 44 comprising polyimide, a suitable etchant for performing the etch process comprises a solution of TMAH (tetramethylammonium hydroxide). If the polymer layer 44 comprises a photoimageable polyimide, an etch mask is not required, as the photoimageable material can be patterned by exposure to UV and then developed using a suitable developing solution.

Figure 4D:
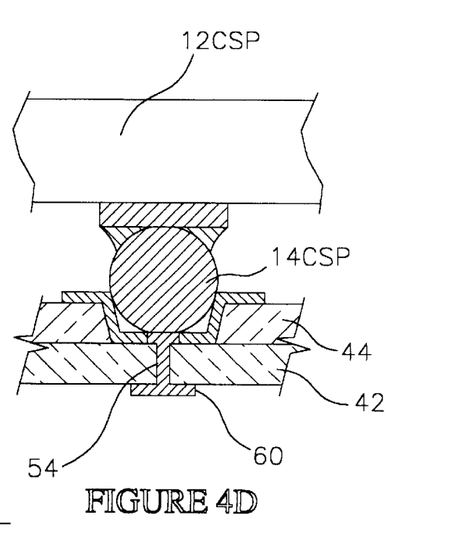
FIG. 4D is an enlarged cross sectional view equivalent to FIG. 4C but illustrating the contact of FIG. 4C electrically engaging a ball contact on a semiconductor component.

A size and shape of the recesses 48 will be determined by the openings in the etch mask used to etch the polymer layer 44, or alternately by the exposure mask used to pattern a photoimageable polymer layer 44. The recesses 48 are sized and shaped to retain and electrically engage the ball contacts 14CSP (FIG. 4D). A representative diameter, or width, of the recesses 48 can be from 2 mils to 50 mils or more. This diameter can be less than a diameter of the ball contacts 14CSP so that only portions of the ball contacts 14CSP will be contacted. A depth of the recesses 48 can be equal to a thickness "t" of the polymer layer 44, or can be less than the thickness "t". A pitch or spacing of the recesses 48 will exactly match a pitch or spacing of the ball contacts 14CSP (FIG. 4D). A pattern P2 of the contacts 46 thus exactly matches a pattern of the ball contacts 14 (e.g., pattern P1—FIG. 1B).

As shown in FIG. 4C, in addition to the recesses 48, the contacts 46 include conductive layers 50 formed within the recesses 48. Peripheral edges 52 of the conductive layers 50 are adapted to penetrate native oxide layers on the ball contacts 14CSP (FIG. 4D) to contact the underlying metal. The conductive layers 50 can be formed as a layer of a highly conductive metal such as aluminum, titanium, nickel, iridium, copper, gold, tungsten, silver, platinum, palladium, tantalum, molybdenum or alloys of these metals.

As also shown in FIG. 4C, the contacts 46 include conductive members 54 formed within through openings 56 in the substrate 42. The openings 56 for the conductive members 54 can be formed by etching, punching, or laser machining the substrate 42. U.S. patent application Ser. No. 08/993,965, filed Dec. 10, 1997, now U.S. Pat. No. 6,107,109, entitled "Semiconductor Interconnect Having Laser Machined Contacts", which is incorporated herein by reference, describes a method for laser machining the openings 56.

As will be more fully explained the conductive members 54 can comprise a metal, such as the previously described metals for the conductive layers 50, or can comprise a conductive polymer.

Still referring to FIG. 4C, the conductive members 54 are formed within the openings in electrical contact with the conductive layers 50. The conductive members 54 provide straight line electrical paths from the contacts 46 on the face 70 of the substrate 42 to the external contact pads 60 on the back side 58 of the substrate 42. The external contact pads 60 are adapted for making electrical connections to the outside, such as test circuitry for performing test procedures. As will be further explained, the pads 60 are adapted for physical and electrical contact by a mating electrical connector (e.g., "POGO PIN") of a test system, or other electrical assembly, that will employ the completed interconnect 40.

Figure 5:
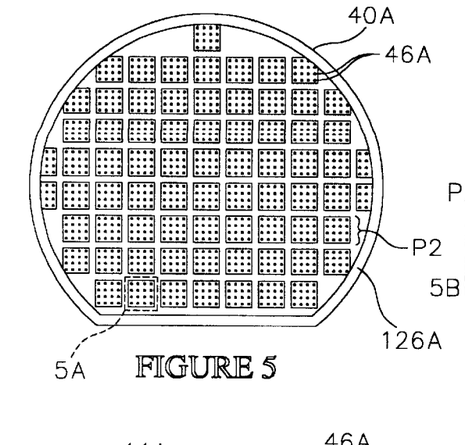
FIG. 5 is a schematic plan view of an alternate embodiment interconnect constructed in accordance with the invention configured for testing semiconductor components having planar contacts.
Figure 5A:
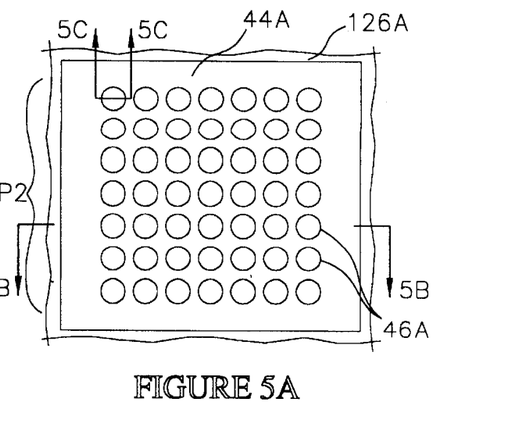
FIG. 5A is an enlarged portion of FIG. 5 taken along section line 5A illustrating a pattern of contacts on the interconnect.
Figure 5B:
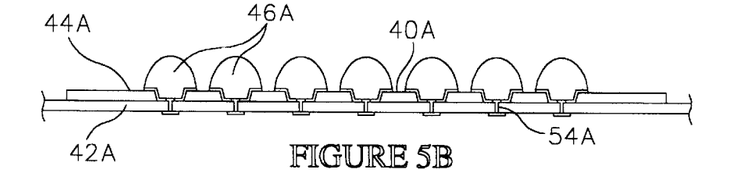
FIG. 5B is a cross sectional view of a portion of the alternate embodiment interconnect taken along section line 5B—5B of FIG. 5A.
Figure 5C:
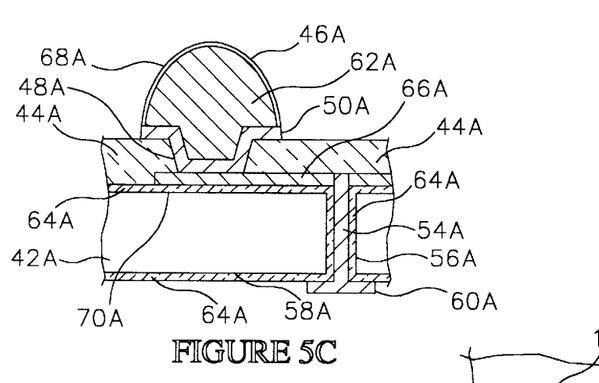
FIG. 5C is an enlarged cross sectional view taken along section line 5C—5C of FIG. 5A illustrating a contact on the alternate embodiment interconnect.
Figure 5D:
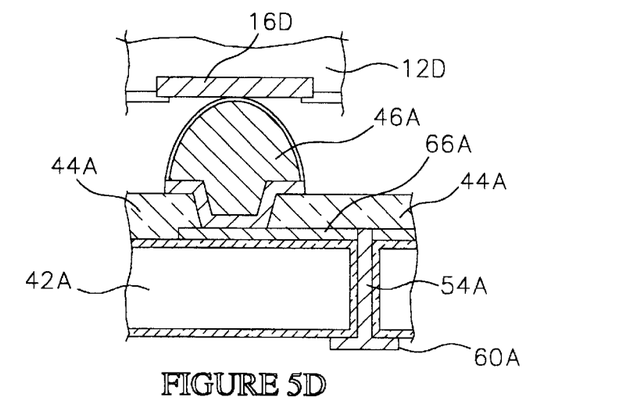
FIG. 5D is an enlarged cross sectional view equivalent to FIG. 5C but illustrating the contact of FIG. 5C electrically engaging a planar contact on a semiconductor component.

Referring to FIGS. 5–5D, an alternate embodiment interconnect 40A is illustrated. The interconnect 40A is adapted to make electrical connections with planar bond pads 16D (FIG. 5D) on semiconductor dice 12D (FIG. 1A) contained on a wafer 10W (FIG. 1A). As, such the interconnect has a peripheral shape corresponding to the semiconductor wafer 10W (FIG. 1A).

The interconnect 40 comprises: a substrate 42A; a polymer layer 44A formed on a face 70A of the substrate 42A; a plurality of patterns P2 of contacts 46A formed on the polymer layer 44A adapted to make temporary electrical connections with the bond pads 16D (FIG. 5D); and a plurality of external contacts pads 60A in electrical communication with the contacts 46A. These elements function substantially the same as the substrate 42, polymer layer 44 and contacts 46 previously described and shown in FIGS. 4–4D.

However, in the alternate embodiment interconnect 40A, the substrate 42A comprises silicon, such that additional insulating layers 64A must be formed to electrically insulate the bulk of the substrate 42A and openings 56A for the conductive members 54A. In addition, the conductive members 54A are offset from the contacts 46A, and are in electrical communication with conductors 66A formed on the substrate 42A. Still further, the conductive members 54A include bumps 62A formed on the conductive layers 50A for electrically engaging the bond pads 16D (FIG. 5D).

The insulating layers 64A can comprise a grown or deposited dielectric material such as $SiO_2$, $Si_3N_4$ or a deposited polymer, such as polyimide. The conductors 66A can comprise a highly conductive metal such as those previously described for conductive layers 50 (FIG. 4C). In addition, the conductors 66A can be formed using a subtractive process as previously described (e.g., blanket deposition, photopatterning and etching of a metal layer), or can be formed using an additive process (e.g., deposition of a metal through openings in a mask). The conductors 66A allow the external contact pads 60A to be formed in a pattern that is different than the pattern P2 of the contacts 46A.

The bumps 62A can be formed on the conductive layers 50A using a suitable deposition process, such as electrolytic, or electroless plating of a metal. Suitable metals for the bumps 62A include copper, nickel, gold and palladium. For some metals such as copper a non-oxidizing layer 68A can be formed on the bumps 62A out of a non-oxidizing metal such as gold. The bumps 62A can also comprise a conductive polymer material such as a silver filled epoxy or isotropic adhesive as previously described for conductive members 54 (FIG. 4C). In this case the conductive polymer material can be deposited on the conductive layers 50A using a process such as screen printing and then cured as required. Still further, the bumps 62A can comprise a solder material deposited by screen printing or by evaporation through a mask.

These and other processes for forming the bumps 62A are described in parent application U.S. Pat. No. 5,808,360 entitled "Microbump Interconnect For Bare Semiconductor Dice"; and in U.S. Pat. No. 5,789,271 entitled "Method For Fabricating Microbump Interconnect For Bare Semiconductor Dice", both of which are incorporated herein by reference.

Figure 6A:
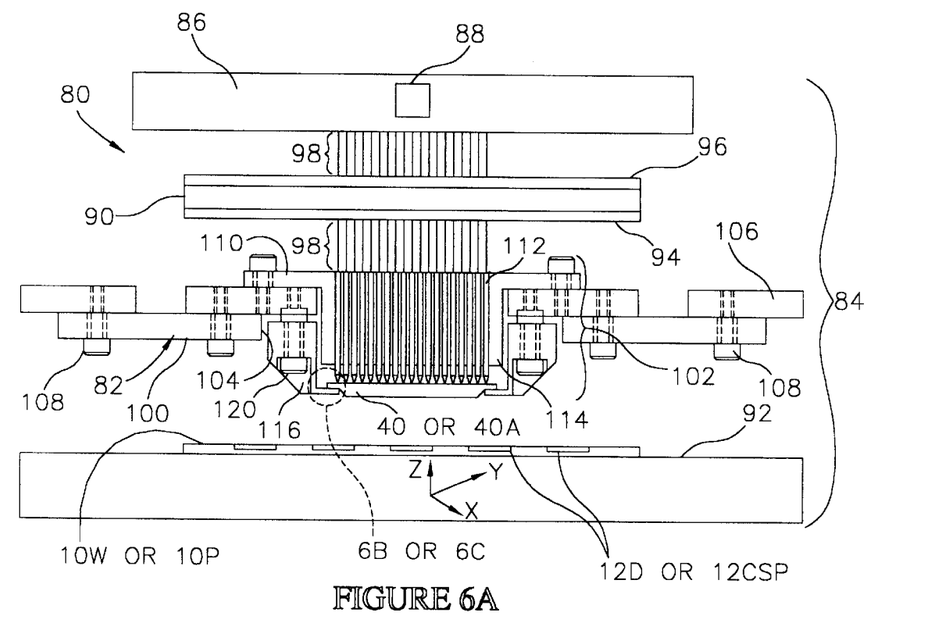
FIG. 6A is a schematic cross sectional view of a wafer level test system employing an interconnect constructed in accordance with the invention.
Figure 6B:
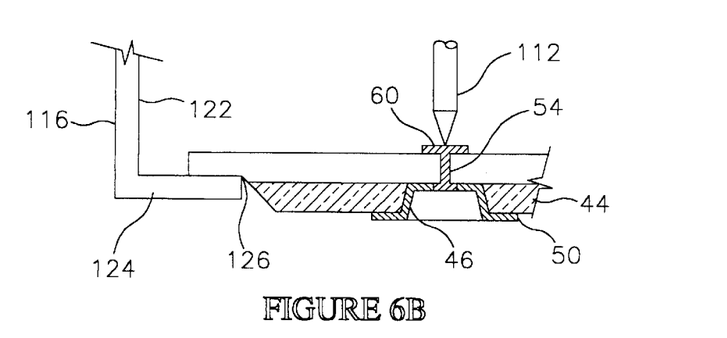
FIG. 6B is an enlarged schematic portion of FIG. 6A taken along section line 6B and illustrating a portion of the interconnect of FIG. 4.
Figure 6C:
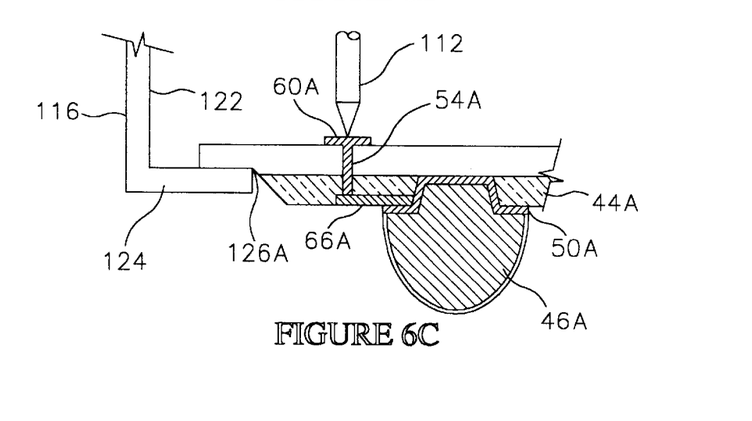
FIG. 6C is an enlarged schematic portion of FIG. 6A taken along section line 6C and illustrating a portion of the interconnect of FIG. 5.

Referring to FIGS. 6A–6C, a wafer test system 80 constructed in accordance with the invention is shown. The test system 80 is configured to test semiconductor dice 12D contained on the semiconductor wafer 10W, or alternately to test chip scale packages 12CSP contained on the panel 10P. The test system 80 includes a probe card 82 which includes the interconnect 40 or 40A. Depending on its configuration, the interconnect 40 or 40A makes temporary electrical connections with ball contacts 14D (FIG. 1C), ball contacts 14CSP (FIG. 2B), or bond pads 16D (FIG. 3) on the components under test. The test system 80 also includes a wafer handler 84, and a tester 86 having test circuitry 88 for applying and analyzing test signals.

The wafer handler 84 interfaces with a test head 90 wherein the probe card 82 is mounted. In addition, the wafer handler 84 includes a wafer chuck 92 configured to move in X and Y directions to align the wafer 10W or the panel 10P, with the probe card 82, and in the Z direction to move the wafer 10W or the panel 10P into contact with the interconnect 40 or 40A. The wafer handler 84 can also include an optical or mechanical alignment system (not shown) for aligning the wafer 10W or the panel 10P, to the interconnect 40 or 40A. One suitable wafer handler 84 is manufactured by Electroglass and is designated a Model 4080.

The test system 80 also includes a prober interface board 94 for routing test signals from the tester 86 to the test head 90, and then to the probe card 82. The prober interface board 94 can be mounted to the test head 90. In addition, the prober interface board 94 can be in electrical communication with tester pin electronics 96 in the test head 90. Separate electrical paths 98 are provided from the test circuitry 88 in the tester 86 to the tester pin electronics 96, and to the prober interface board 94. The prober interface board 94 includes separate electrical paths 98 to the probe card 82.

The probe card 82, generally stated, comprises: a probe card substrate 100; the interconnect 40 or 40A; and a force applying mechanism 102. The probe card substrate 100 can comprise an electrically insulating material, such as a glass filled resin (e.g., FR-4), a ceramic, or plastic. The probe card substrate 100 includes an opening 104 wherein the force applying mechanism 102 is mounted. Viewed from above, the opening 104 is generally rectangular shaped to accommodate a mating rectangular shape of the force applying mechanism 102. However, as is apparent, a rectangular shape is merely exemplary.

The probe card substrate 100 can be attached to a probe card fixture 106 mounted within the test head 90. Threaded fasteners 108 can be used to removably attach the probe card substrate 100 to the probe card fixture 106. If desired, the probe card substrate 100 can be a conventional probe card having the middle portion removed to form the opening 104. The probe card fixture 106 can also be a conventional component. Conventional probe cards and probe card fixtures are available from Packard Hughes Interconnect, Los Angeles, Calif., and Wentworth Laboratories, Sunnyvale, Calif.

The force applying mechanism 102 includes a base 110 which attaches to the probe card substrate 100. In addition, the force applying mechanism 102 includes a plurality of spring loaded electrical connectors 112 mounted to a pin mounting plate 114 attached to the base 110. The electrical connectors 112 physically and electrically engage the external contact pads 60 (FIG. 6B) or 60A (FIG. 6C). The electrical connectors 112 can be commercially available spring loaded electrical connectors, such as "POGO PINS" manufactured by Pogo Industries of Kansas City, Kans. Other suitable spring loaded electrical connectors include "DURASEAL" connectors manufactured by IDI, Kansas City, Kans.

The interconnect 40 or 40A is slidably mounted to a two piece interconnect support plate 116 that attaches to the probe card substrate 100 with threaded fasteners 108. In addition, spring biased threaded fasteners 120 allow a planarity of the interconnect support plate 116 to be adjusted.

As shown in FIGS. 6A–6C, the interconnect support plate 116 includes an opening 122 formed with a peripheral lip 124 for supporting the interconnect 40 or 40A. The interconnect 40 or 40A includes a stepped surface 126 (FIG. 6B) or 126A (FIG. 6C) that engages the lip 124 and allows the interconnect contacts 46 (FIG. 6B) or 46A (FIG. 6C) to project from the interconnect support plate 116. The stepped surface 126 or 126A of the interconnect 40 or 40A can be formed by an etching or a machining process during fabrication of the interconnect 40 or 40A.

The peripheral lip 124 of the interconnect support plate 116 prevents the interconnect 40 or 40A from separating from the interconnect support plate 116. However, the interconnect 40 or 40A is movable within the opening 122 in the z-direction towards the electrical connectors 112. The opening 122 can be sized to prevent excessive movement of the interconnect 40 or 40A in the X and Y directions. If desired, dots of a resilient polymer material such as silicone can be placed in a gap between the interconnect 40 or 40A and opening 122. The dots of resilient material can be used to retain the interconnect 40 or 40A while allowing some Z-direction movement of the interconnect 40 or 40A.

The interconnect 40 or 40A is maintained in a stationary position within the opening 122 by spring pressure exerted by the electrical connectors 112. However, during a test procedure, the wafer 10W or the panel 10P, can be overdriven in the z-direction with respect to the interconnect 40 or 40A, to move the interconnect 40 or 40A in the z-direction towards the electrical connectors 112. With the z-direction overdrive, a contact force with which the interconnect contacts 46 (FIG. 6B) or 46A (FIG. 6C) press into the contacts 14D (FIG. 1C) or 16D (FIG. 3) or 14CSP (FIG. 2B) on the components under test is generated by compression of the spring components of the electrical connectors 112. In addition, the polymer layer 44 (FIG. 6B) under contacts 46 (FIG. 6B), or the polymer layer 44A (FIG. 6C) under contacts 46A (FIG. 6C) allows individual contacts 46 or 46A to move in the z-direction to accommodate difference in the z-direction location and planarity of the contacts 14D (FIG. 1C) or 16D (FIG. 3) or 14CSP (FIG. 2B).

The force exerted by the electrical connectors 112 will be dependent on a spring constant, and amount of compression, of the spring components of the electrical connectors 112. A representative value for the force F can be from 0.10 oz to 1.5 oz per electrical connector 112. As used herein, the term z-direction overdrive refers to movement of the wafer 10W or panel 10P, or of the probe card 82, towards one another past the initial point of contact between the interconnect contacts 46 or 46A and the external contacts 16D or 14CSP. The z-direction overdrive determines the amount of compression in the spring components of the electrical connectors 112 and thus the magnitude of the force. A representative amount of z-direction overdrive can be from 0.25 mils to 8 mils.

Figure 7A:
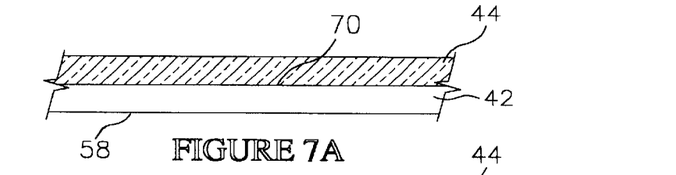
FIGS. 7A–7F are schematic cross sectional views illustrating process steps for fabricating the interconnect of FIGS. 4–4C or FIGS. 5–5D.

Referring to FIGS. 7A–7F, steps in a method for fabricating the interconnect 40 (FIG. 4A) are illustrated. As shown in FIG. 7A, the substrate 42 can be provided. Preferably, the substrate 42 comprises a wafer of material on which multiple interconnects will be fabricated using semiconductor circuit fabrication techniques, and then singulated by cutting the wafer. Such a process is referred to as a wafer level fabrication process.

In the embodiment illustrated in FIGS. 7A–7F, the substrate 42 comprises an electrically insulating material such as a ceramic material, or reinforced polymer laminate, such as bismaleimide triazine (BT), or an epoxy resin (e.g., FR-4).

The substrate 40 includes the face 70 and the opposing back side 58. The face 70 and back side 58 of the substrate 40 are planar surfaces generally parallel to one another. A representative thickness of the substrate 10 can be from about 12 mils to 38 mils.

As shown in FIG. 7A the polymer layer 44 is initially deposited on the face 70 of the substrate 40. Suitable materials for the polymer layer 44 include polyimide, photoimageable polyimide, polyester, epoxy, urethane, polystyrene, silicone and polycarbonate. In the illustrative embodiment, the polymer layer 44 comprises a photoimageable polyimide which can be patterned using UV and then developed using a developer solution. Photosensitive polyimide compositions are commercially available, and are described in U.S. Pat. Nos. 5,589,319; and 5,616,448.

The polymer layer 44 can be blanket deposited to a desired thickness using spin coating or other suitable process. A representative thickness can be from 0.5 $\mu$m to 150 $\mu$m. Following blanket deposition the polymer layer 44 can be soft baked (e.g., 100° C. for several minutes) and then subjected to UV exposure energy at a suitable intensity (e.g., I-line at 230–330 mJ/cm$^2$). The exposed polymer layer 44 can then be cleaned and cured by heating in an inert ambient for several hours (e.g., 350° C. for 2–3 hours).

Figure 7B:
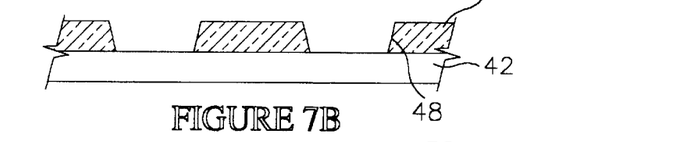

As shown in FIG. 7B, following curing the polymer layer 44 can be developed with the recesses 48 for the contacts 46. Depending on the formula of the polymer layer different developing solutions can be employed to form the recesses 48. One suitable developing solution comprises an aqueous solution of tetramethylammonium hydroxide (TMAH). The recesses 48 have a size and pattern that corresponds to the size and pattern of the ball contacts 14 (FIG. 4D) on the component 12 (FIG. 4D). In the illustrative embodiment the recesses 48 extend completely through the polymer layer 44 and end point at the face 70 of the substrate 42. Alternately the exposure and developing steps can be controlled such that the recesses 48 end point within the polymer layer 44.

If the polymer layer 44 does not comprise a photosensitive material, the recesses 48 can be etched by formed a photomask and etching through openings in the mask. The recesses 48 can also be formed using a laser, or using a machining process.

Figure 7C:
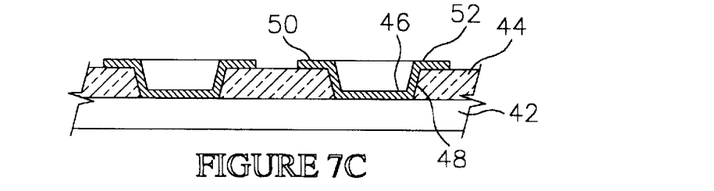

As shown in FIG. 7C, following formation of the recesses 48, the conductive layers 50 are formed within the recesses 48. Peripheral edges 52 of the conductive layers 50 are adapted to penetrate native oxide layers on the ball contacts 14CSP (FIG. 4D) to contact the underlying metal. The conductive layers 50 can be formed as a layer of a highly conductive metal such as aluminum, titanium, nickel, iridium, copper, gold, tungsten, silver, platinum, palladium, tantalum, molybdenum or alloys of these metals. Rather than being a single layer of metal, the conductive layers 50 can be formed as multi-layered stacks of metals (e.g., bonding layer/barrier layer). Rather than being a single layer of metal, the conductive layers 50 can be formed as multi-layered stacks of metals (e.g., bonding layer/barrier layer). Also, the conductive layers 50 can comprise an alloy such as TiN, TiW, TiC or NiB.

The conductive layers 50 can be formed using a metallization process (e.g., deposition, photopatterning, etching). An exemplary metallization process is disclosed in U.S. Pat. No. 5,607,818, incorporated herein by reference. The conductive layers 50 can also be formed using a plating process, such as electrolytic deposition, or electroless deposition. A representative thickness of the conductive layers 50 is from 600 Å to 20000 Å.

Figure 7D:
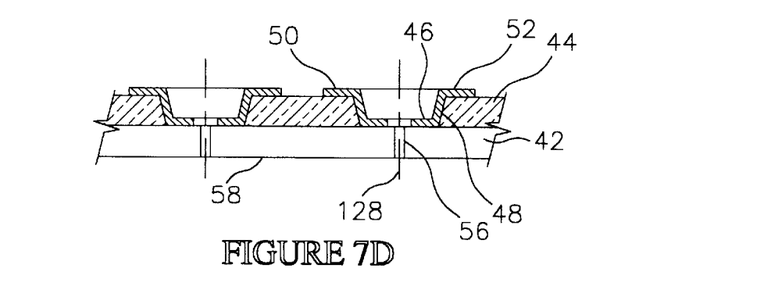

As shown in FIG. 7D, following formation of the conductive layers 50, openings 56 can be formed through the conductive layers 50, and through the substrate 42 to the back side 58 thereof. One method for forming the openings 56 is with a laser machining process.

A suitable laser machining apparatus is manufactured by General Scanning of Sommerville, Mass. and is designated a model no. 670-W. A representative diameter of the openings 56 is from 10 $\mu$m to 2 mils or greater. A representative laser fluence for forming the openings 56 is from 2 to 10 watts/per opening at a pulse duration of 20–25 ns and at a repetition rate of up to several thousand per second. The wavelength of the laser beam can be a standard infrared or green wavelength (e.g., 1064 nm–532 nm).

Figure 7E:
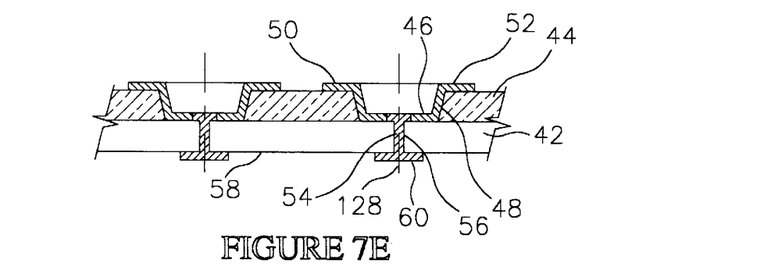

In FIG. 7D, the openings 56 are generally perpendicular to the face 70 and back side 58 of the substrate 52. In addition, the openings 56 are located along a longitudinal axis 128 which will be the center line of the completed contacts 46 (FIG. 7E). Alternately, the openings 56 can be offset from the center line of the contacts 46 or outside of the contacts 46.

As shown in FIG. 7E, following formation of the openings 56, the conductive members 54 can be formed within the openings 56. The conductive members 34 can comprise a metal, such as the previously described metals for the conductive layers 50. The metal can be deposited within the openings 56 using a deposition process, such as CVD, electrolytic deposition or electroless deposition. A solder metal can be screen printed in the openings 56, as well as with capillary action, or with a vacuum system using a hot solder wave. In addition, the conductive members 54 can be plugs that completely fill the openings 56, or alternately can be layers that cover just the inside surfaces or sidewalls of the openings 56.

Rather than being a metal, the conductive members 54 can comprise a conductive polymer, such as a metal filled silicone, or an isotropic epoxy. Suitable conductive polymers are sold by A.I. Technology, Trenton, N.J.; Sheldahl, Northfield, Minn.; and 3M, St. Paul, Minn. A conductive polymer can be deposited within the openings 56, as a viscous material, and then cured as required. A suitable deposition process, such as screen printing, or stenciling, can be used to deposit the conductive polymer into the openings 56.

As also shown in FIG. 7E, the conductive members 54 can include the contact pads 60 formed along the back side 58 of the substrate 42. The pads 60 can have a circular, square, rectangular or other peripheral configuration. As also shown in FIG. 7E, the pads 60 can be formed along a center line coincident to the axis 128 or can be offset from the axis 128.

The pads 60 can be formed during formation of the conductive members 54 using a suitable mask (not shown), such as a hard mask, or a stencil mask. For example, a metal can be blanket deposited on the back side 58 of the substrate 42 and into the openings 56 and then etched to form the pads 60. Alternately the pads 60 can comprise a different material than the conductive members 54, and can be formed using a separate deposition process.

Figure 7F:
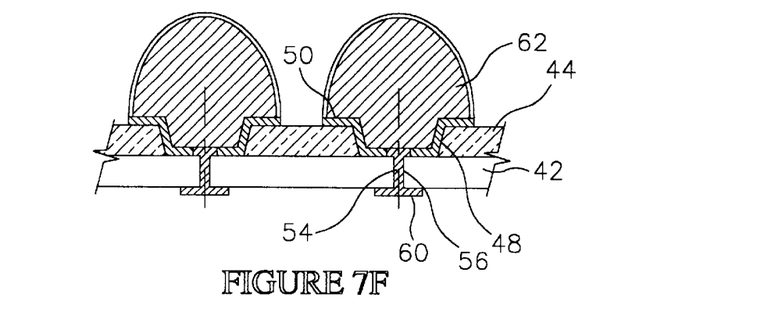

FIG. 7E illustrates the completed contacts 46 which are adapted to electrically contact ball contacts 14CSP (FIG. 4D). Optionally as shown in FIG. 7F bumps 62 can be formed on the conductive layer 50 for contacting planar bond pads 16D (FIG. 5D). The bumps 62 can comprise a metal or a conductive polymer deposited as previously described.

The interconnect 40A (FIG. 5A) can be formed using substantially the same process steps outlined in FIGS. 7A–7F. However, with the substrate 42A comprising a semiconducting material, such as silicon, additional insulating layers 64A can be formed substantially as previously described. In addition, the conductive members 54A (FIG. 5C) can be offset from the contacts 46A by forming the conductors 66A (FIG. 5C) in a required pattern substantially as previously described.

Thus the invention provides an interconnect for testing semiconductor components contained on a substrate. Also provided are a test system employing the interconnect, and a method for fabricating the interconnect. Although the invention has been described with reference to certain preferred embodiments, as will be apparent to those skilled in the art, certain changes and modifications can be made without departing from the scope of the invention as defined by the following claims.

I claim:

1. A method for fabricating an interconnect for a semiconductor component having a contact comprising:
    providing a substrate having a first side and an opposing second side;
    forming an electrically insulating, resilient polymer layer on the first side having a thickness;
    forming a recess in the polymer layer configured to retain the contact, and having a depth equal to the thickness, by endpointing the recess on the first side;
    forming a conductive layer within the recess configured to electrically engage the contact;
    forming an opening through the substrate to the second side;
    forming a conductive material in the opening in electrical communication with the conductive layer; and
    forming an external contact on the second side in electrical communication with the conductive material.

2. The method of claim 1 wherein the polymer layer comprises a photoimageable material, and the forming the recess step comprises developing the polymer layer to the first side.

3. The method of claim 1 wherein the polymer layer comprises an etchable material, and the forming the recess step comprises etching the polymer layer to the first side.

4. The method of claim 1 further comprising slidably mounting the substrate to a support such that the substrate is movable in a z-direction with a spring loaded electrical connector electrically engaging the external contact and biasing the substrate against the component.

5. A method for fabricating an interconnect for a semiconductor component having a contact comprising:
    providing a substrate having a first side and an opposing second side;
    forming an electrically insulating, resilient polymer layer on the first side having a thickness;
    forming a recess in the polymer layer having a depth equal to the thickness, by etching or developing the polymer layer to an endpoint on the first side;
    forming a conductive layer within the recess;
    forming an opening through the substrate to the second side;
    forming a conductive material within the opening in electrical communication with the conductive layer;
    forming an electrically conductive bump in the recess and on the conductive layer; and
    forming an external contact on the second side in electrical communication with the conductive material.

6. The method of claim 5 further comprising slidably mounting the substrate to a support such that the substrate is movable in a z-direction with a spring loaded electrical connector electrically engaging the external contact and biasing the substrate against the component.

7. The method of claim 5 wherein the polymer layer comprises an etchable material and the forming the recess step comprises etching the polymer layer to the endpoint.

8. The method of claim 5 wherein the polymer layer-has a thickness of from 0.5 $\mu$m to 150 $\mu$m.

9. The method of claim 5 wherein the polymer layer comprises a photoimageable material and the forming the recess step comprises developing the polymer layer to the endpoint.

10. A method for fabricating an interconnect for a semiconductor component having a plurality of contacts comprising:

providing a substrate having a face and a back side;

depositing an electrically insulating, resilient polymer layer on the face;

forming a plurality of interconnect contacts on the polymer layer comprising recesses, and conductive layers on the recesses configured to electrically engage the contacts;

forming a plurality of conductive members in the substrate in electrical communication with the conductive layers;

forming a plurality of external contacts on the back side in electrical communication with the conductive members;

providing a support plate comprising an opening and a lip configured to support the substrate;

mounting the substrate to the support plate with the interconnect contacts projecting from the opening, and the substrate movable in a z-direction; and placing the external contacts in physical and electrical contact with a plurality of spring loaded electrical connectors configured to bias the substrate against the component and to allow movement of the substrate in the z-direction.

11. The method of claim 10 wherein the contacts on the component comprise balls, and the recesses are configured to retain the balls.

12. The method of claim 10 wherein the contacts on the component comprise planar pads, and the conductive layers comprise bumps configured to electrically engage the planar pads.

13. The method of claim 10 wherein the polymer layer comprises a photoimageable material and the forming the interconnect contacts step comprises developing the polymer layer and endpointing the developing on the face of the substrate.

14. A method for fabricating an interconnect for a semiconductor component having a plurality of contacts comprising:

providing a substrate having a face and a backside;

depositing an electrically insulating, resilient photoimageable polymer layer on the face having a thickness;

developing the polymer layer to form a plurality of recesses therein;

endpointing the developing step on the face such that the recesses have a depth equal to the thickness;

depositing a plurality of conductive layers in the recesses;

forming a plurality of conductive members in the substrate in electrical communication with the conductive layers; and forming a plurality of external contacts on the backside in electrical communication with the conductive members.

15. The method of claim 14 further comprising slidably mounting the substrate to a support such that the substrate is movable in a z-direction with a plurality of spring loaded electrical connectors electrically engaging the external contacts and biasing the substrate against the component.

16. The method of claim 14 further comprising forming a plurality of bumps on the conductive layers.

17. The method of claim 14 wherein the contacts on the component comprise balls and the recesses are configured to retain the balls.

18. The method of claim 14 wherein the photoimageable polymer layer comprises photoimageable polyimide.

* * * * *